United States Patent
Wu et al.

(10) Patent No.: US 9,824,987 B2
(45) Date of Patent: *Nov. 21, 2017

(54) SEMICONDUCTOR STRUCTURE WITH COMPOSITE BARRIER LAYER UNDER REDISTRIBUTION LAYER AND MANUFACTURING METHOD THEREOF

(71) Applicant: TAIWAN SEMICONDUCTOR MANUFACTURING CO., LTD., Hsinchu (TW)

(72) Inventors: Chun-Yu Wu, Changhua County (TW); Yu-Wei Shang, Tainan (TW); Chung-Ruei Kang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/204,961

(22) Filed: Jul. 7, 2016

(65) Prior Publication Data

US 2016/0322316 A1 Nov. 3, 2016

Related U.S. Application Data

(63) Continuation of application No. 14/278,729, filed on May 15, 2014, now Pat. No. 9,418,951.

(51) Int. Cl.
*H01L 23/00* (2006.01)
*H01L 23/498* (2006.01)
(Continued)

(52) U.S. Cl.
CPC ........ *H01L 24/02* (2013.01); *H01L 23/49811* (2013.01); *H01L 23/53223* (2013.01);
(Continued)

(58) Field of Classification Search
None
See application file for complete search history.

(56) References Cited

U.S. PATENT DOCUMENTS 6,368,967 B1    4/2002   Besser
9,418,951 B2 *   8/2016   Wu .................. H01L 23/53223
(Continued)

FOREIGN PATENT DOCUMENTS

CN        1627480 A    6/2005

OTHER PUBLICATIONS

Interfacial Mechanism Studies of Electroless Plated Cu Films on a-Ta: N layers Catalyzed by Pill (Jian-Hong Lin et al., J. Vac. Sci. Technol. A. vol. 20, No. 3, May/Jun. 2002).
(Continued)

*Primary Examiner* — Andres Munoz
(74) *Attorney, Agent, or Firm* — Maschoff Brennan

(57) ABSTRACT

A mechanism of a semiconductor structure with composite barrier layer under redistribution layer is provided. A semiconductor structure includes a substrate comprising a top metal layer on the substrate; a passivation layer over the top metal layer having an opening therein exposing the top metal layer; a composite barrier layer over the passivation layer and the opening, the composite barrier layer includes a center layer, a bottom layer, and an upper layer, wherein the bottom layer and the upper layer sandwich the center layer; and a redistribution layer (RDL) over the composite barrier layer and electrically connecting the underlying top metal layer.

20 Claims, 7 Drawing Sheets

(51) Int. Cl.
*H01L 23/532* (2006.01)
*H01L 23/525* (2006.01)
*H01L 23/31* (2006.01)

(52) U.S. Cl.
CPC .............. *H01L 24/05* (2013.01); *H01L 24/11* (2013.01); *H01L 24/13* (2013.01); *H01L 24/81* (2013.01); *H01L 23/3192* (2013.01); *H01L 23/525* (2013.01); *H01L 24/03* (2013.01); *H01L 2224/0226* (2013.01); *H01L 2224/0231* (2013.01); *H01L 2224/0237* (2013.01); *H01L 2224/0239* (2013.01); *H01L 2224/02251* (2013.01); *H01L 2224/02315* (2013.01); *H01L 2224/02317* (2013.01); *H01L 2224/02331* (2013.01); *H01L 2224/02379* (2013.01); *H01L 2224/0401* (2013.01); *H01L 2224/05008* (2013.01); *H01L 2224/05022* (2013.01); *H01L 2224/05024* (2013.01); *H01L 2224/05569* (2013.01); *H01L 2224/05572* (2013.01); *H01L 2224/05647* (2013.01); *H01L 2224/05655* (2013.01); *H01L 2224/05666* (2013.01); *H01L 2224/05681* (2013.01); *H01L 2224/13026* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2924/01007* (2013.01); *H01L 2924/01013* (2013.01); *H01L 2924/01022* (2013.01); *H01L 2924/01029* (2013.01); *H01L 2924/01073* (2013.01); *H01L 2924/04941* (2013.01); *H01L 2924/04953* (2013.01)

(56) References Cited

U.S. PATENT DOCUMENTS

| | | |
|---|---|---|
| 2001/0045651 A1 | 11/2001 | Saito et al. |
| 2003/0052409 A1 | 3/2003 | Matsuo et al. |
| 2005/0085070 A1 | 4/2005 | Park |
| 2006/0267198 A1 | 11/2006 | Lin et al. |

OTHER PUBLICATIONS

Comparative study of Ta, TaN and Ta/TaN bi-layer barriers for Cu-ultra low-k porous polymer integration (L.Y. Yang, et al., Thin Solid Films, 462-463, pp. 176-181, Jun. 2004).

\* cited by examiner

SEMICONDUCTOR STRUCTURE WITH COMPOSITE BARRIER LAYER UNDER REDISTRIBUTION LAYER AND MANUFACTURING METHOD THEREOF

PRIORITY CLAIM AND CROSS-REFERENCE

The present application is a continuation application of U.S. application Ser. No. 14/278,729 filed on May 15, 2014. The entire disclosures of the above applications are hereby incorporated by reference herein.

BACKGROUND

The manufacture of an integrated circuit (IC) has been largely driven by the need to reduce the size of a semiconductor device and to increase the density of the integrated circuit in the semiconductor device. Wire bonding connects the semiconductor device to the packaging substrate. When the size of the semiconductor device shrinks, IC packaging process also needs to be improved to decrease the package size. However, the bond wiring requires additional space for IC packaging and may results in signal delay in the application of high-speed semiconductor devices.

A packaging method for packaging smaller semiconductor devices is known as wafer level packaging (WLP), in which integrated circuit dies are packaged together. Redistribution layer (RDL) is formed over interconnect structures of the integrated circuit dies to rewire and reposition external terminals at desired positions. The RDL included in the WLP is also to fan out wirings for contact pads of the respective integrated circuit die so that electrical contact can be made at a larger pitch than that of contact pads of the die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
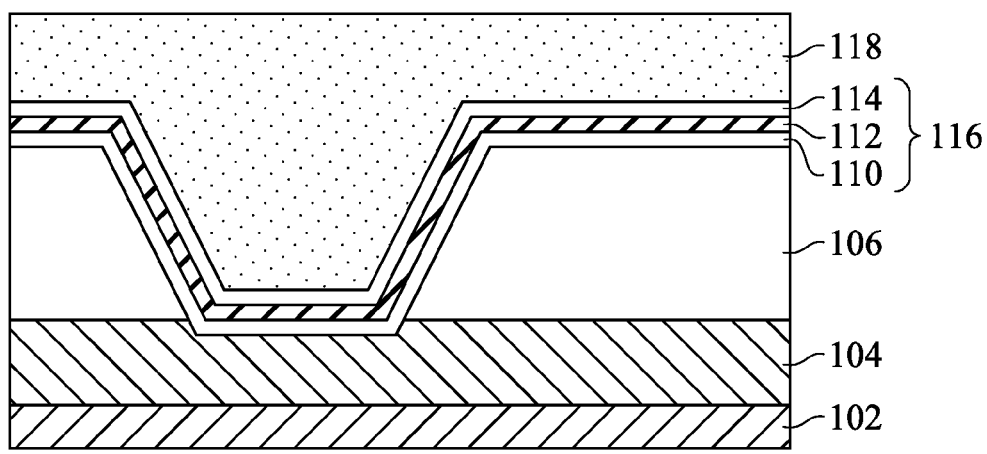
FIG. 1 is a cross-sectional view of a semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, the terms "comprising," "including," "having," "involving," and the like are to be understood to be open-ended, i.e., to mean including but not limited to.

The singular forms "a," "an" and "the" used herein include plural referents unless the context clearly dictates otherwise. Therefore, reference to, for example, a dielectric layer includes embodiments having two or more such dielectric layers, unless the context clearly indicates otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

RDL is usually formed over the interconnect structures, electrically connecting with a top metal layer of the interconnect structures to rewire. For semiconductor testing, a reliability test is operated for a semiconductor products, which is an accelerated life test over periods of time by applying higher voltage, temperature or stress than in actual using conditions. In some examples, semiconductor chips may have considerable resistance shift after a long time baking. For example, a resistance shift is over 75% after baking at 275° C. for 2000 hours. The high resistance shift is formed by the material in RDL diffused into the top metal layer, and the material in the top metal layer of the interconnect structures also diffused into the RDL during the test. A diffusion barrier layer which is formed between the RDL and the interconnect structures can not bear the high temperature, for example, TaN diffusion barrier layer may crystallized after long term 275° C. backing, making the material in the RDL and the top metal layer may migrate mutually. Therefore, a mechanism for a semiconductor structure is provided, which may suppress the material in the RDL and the top metal layer migrating into the other side and generate resistance shift and stress migration under high temperature. This semiconductor structure with composite barrier layer also can effectively suppress the material mutual migrating from different metal layers.

Referring to FIG. 1, FIG. 1 is a cross-sectional view of a semiconductor structure, in accordance with some embodiments. A semiconductor structure includes a substrate 102, which includes a top metal layer 104 on the substrate 102. The substrate 102 may include a semiconductor material like silicon, germanium, carbon, another semiconductor material as an III-V or II-VI material, or combinations thereof. The substrate 102 also includes transistors and other devices, as well as other interconnect structures formed over the devices. Only the top metal layer 104 which is the top of the interconnect structures is shown for simplicity. The top metal layer 104 may include copper, copper alloy, aluminum, aluminum alloy, tungsten, other metal alloy and metal compound. A passivation layer 106 is formed over the top metal layer 104. The passivation layer 106 may include common passivation material such as silicon oxide, silicon nitride, undoped silicate glass (USG), silicon oxynitride, tetraethoxy silane (TEOS), fluorinated silica glass (FSG), boro-phosphorous silicate glass (BPSG) and other low-k materials. An opening is formed in the passivation layer 106 and exposing the top metal layer 104. A composite barrier layer 116 is formed over the passivation layer 106 and the opening. The composite barrier layer 116 includes a bottom layer 110 over the passivation layer 106 and the opening, a center layer 112 over the bottom layer 110; and an upper layer 114 over the center layer 112. The center layer 112 includes tantalum nitride (TaN) or titanium nitride (TiN). And the thickness of the center layer 112 is in a range from about 10 nm to about 300 nm. The bottom layer 110 and the upper layer 114 both include tantalum (Ta) or titanium (Ti). And the thickness of the bottom layer 110 and the upper layer 114 are both in a range from about 1 nm to about 30 nm. A redistribution layer (RDL) is formed over the composite barrier layer 116 and electrically connecting the underlying top metal layer 104. The RDL 118 may include conductive materials such as aluminum, aluminum alloy, copper, copper alloy, tungsten, doped polysilicon, other metal alloy and metal compound. The composite barrier layer 116 may prevent a material of the RDL diffuse into the passivation layer 106 and the top metal layer 104. Also the composite barrier layer 116 may suppress the different material in the RDL 118 and the top metal layer 104 diffuse through the composite barrier layer 116 into the other side. Furthermore, the composite barrier layer 116 may still be effective under high temperature and long time using, for example, about 275° C. for 2000 hours.

In various embodiments of the present disclosure, the RDL 118 may include aluminum, which is easier to patterning and etching than copper, and the top metal layer 104 may include copper, which has lower resistivity and higher thermal conductivity than aluminum. The composite barrier layer 116 includes the center layer 112 including TaN, the bottom layer 110 including Ta, and the upper layer including Ta. The composite barrier layer 116 may bear the reliability test after baking at 275° C. for 2,000 hours, making the resistance shift of the semiconductor structure less than 10%. Because the TaN in the center layer 112 may crystallize at 275° C., which may let the materials in the RDL 118 and the top metal layer 104 diffuse through the center layer 112, the bottom and upper layers both including Ta may enhance barrier strength to block the diffusion and also improve the stress migration performance. Also the composite barrier layer 116 may reduce the initial resistance and deviation of the semiconductor structure to enhance process control ability. In some embodiments, the composite barrier layer 116 includes the center layer 112 including TiN and the bottom and upper layers 110, 114 both including Ti.

Figure 2A:
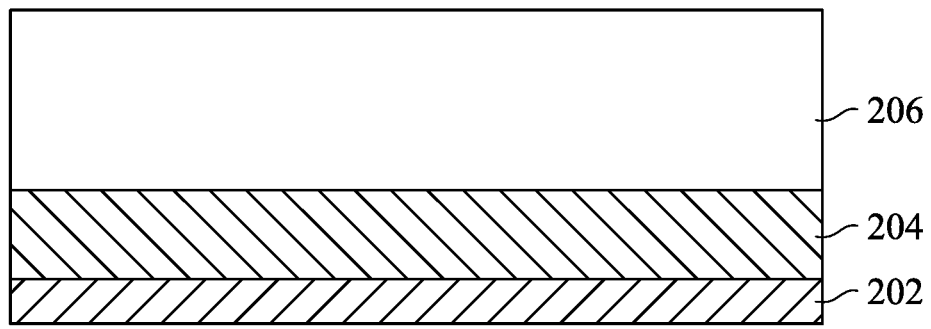
FIGS. 2A-2I are cross-sectional views at various stages of fabricating the semiconductor structure, in accordance with some embodiments.

Referring to FIGS. 2A-2I, FIGS. 2A-2I are cross-sectional views at various stages of fabricating the semiconductor structure, in accordance with some embodiments. Referring to FIG. 2A, a passivation layer 206 is formed over a substrate 202 including a top metal layer 204 on it. The substrate 202 may include a semiconductor material like silicon, germanium, carbon, another semiconductor material as an III-V or II-VI material, or combinations thereof. The substrate 202 also includes transistors and other devices, as well as other interconnect structures formed over the devices. Only the top metal layer 204 which is the top of the interconnect structures is shown for simplicity. The top metal layer 204 may include copper, copper alloy, aluminum, aluminum alloy, tungsten, other metal alloy and metal compound. The passivation layer 206 may include common passivation material such as silicon oxide, silicon nitride, silicon oxynitride, USG, TEOS, FSG, BPSG and other low-k materials. The passivation layer may be formed by deposition method like chemical vapor deposition (CVD), physical vapor deposition (PVD), plasma enhanced CVD (PECVD), sputtering, electrolytic plating, or other suitable methods.

Figure 2B:
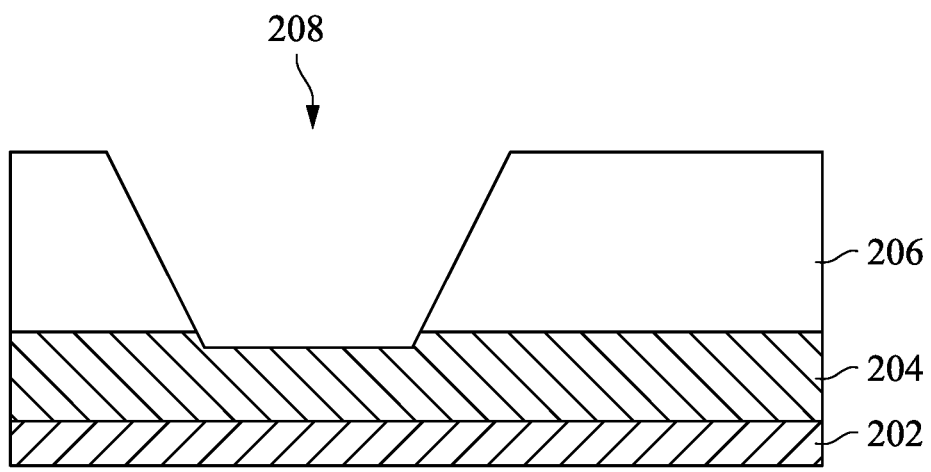

Referring to FIG. 2B, an opening 208 is formed in the passivation layer 206 and exposing the top metal layer 204. The opening 208 may be formed by conventional lithography technology and etching methods such as dry etching, wet etching, or reactive ion etching (RIE). In some embodiments, a plasma cleaning is performed to clean the top metal layer 204 for 20 angstrom.

Figure 2C:
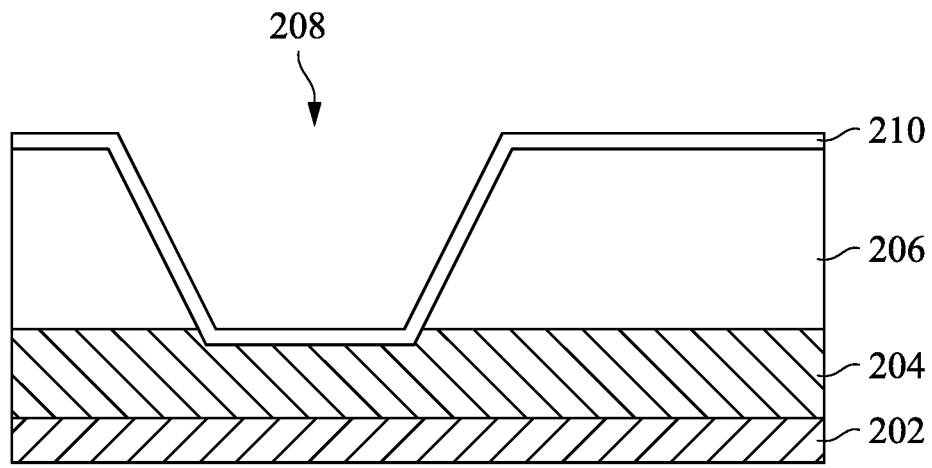
Figure 2D:
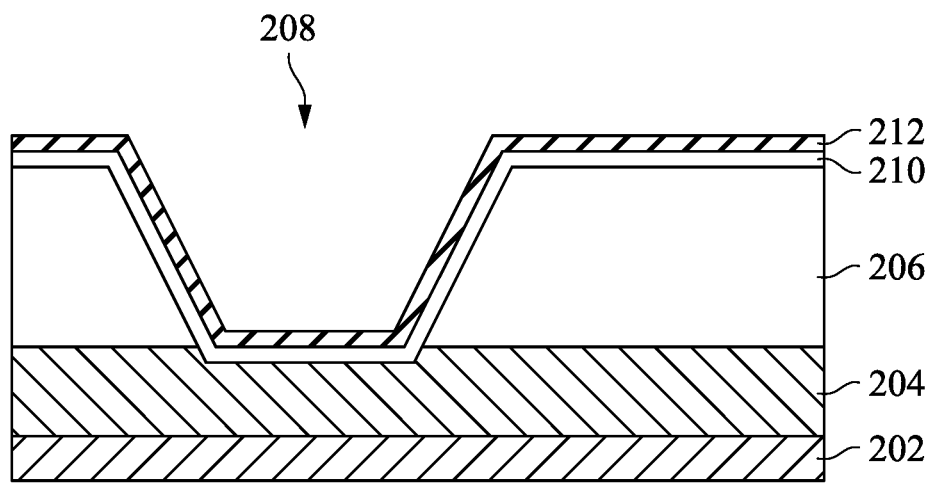
Figure 2E:
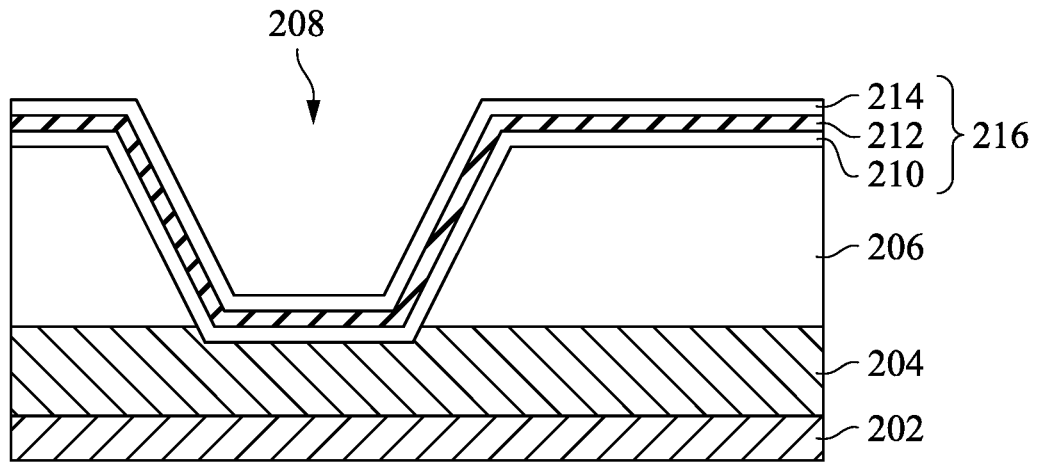

Referring to FIGS. 2C-2E, a composite barrier layer 216 is formed over the passivation layer 206 and the opening 208. The composite barrier layer 216 includes a center layer 212, a bottom layer 210, and an upper layer 214. The bottom layer 210 and the upper layer 214 sandwich the center layer 212. Referring to FIG. 2C, a bottom layer 210 is formed over the passivation layer 206 and the opening 208. The bottom layer 210 may be deposited by PVD, atomic layer deposition (ALD) or other suitable deposition method. The bottom layer 210 may include tantalum (Ta) or titanium (Ti). The thickness of the bottom layer 210 is in a range from about 1 nm to about 30 nm.

Referring to FIG. 2D, the center layer 212 is formed over the bottom layer 210. The center layer 212 may be deposited by the same method as forming the bottom layer 210, such as PVD or ALD. The center layer 212 may include tantalum nitride (TaN) or titanium nitride (TiN). The thickness of the center layer 212 is in a range from about 10 nm to about 300 nm.

Referring to FIG. 2E, the upper layer 214 is formed over the center layer 212. The upper layer 214 may be deposited by the same method as forming the center layer 212, such as PVD or ALD. The upper layer 214 may include tantalum nitride (Ta) or titanium nitride (Ti). The thickness of the upper layer 214 is in a range from about 1 nm to about 30 nm. The bottom layer 210 and the upper layer 214 may enhance the performance of the center layer 212 as a diffusion barrier under high temperature about 275° C. The bottom layer 210 may not only block other materials diffuse through it, but also may enhance the adhesive for the composite barrier layer 216 to the passivation layer 206 and the top metal layer 204. In various embodiments, the composite barrier layer 216 is formed by one PVD process, which forms the bottom layer 210 with Ta first, than add $N_2$ gas to form the center layer 212 including TaN, last forming the upper layer 214 with Ta. The PVD process may operate in currently in-line metal PVD, therefore no cost for new apparatus is needed.

Figure 2F:
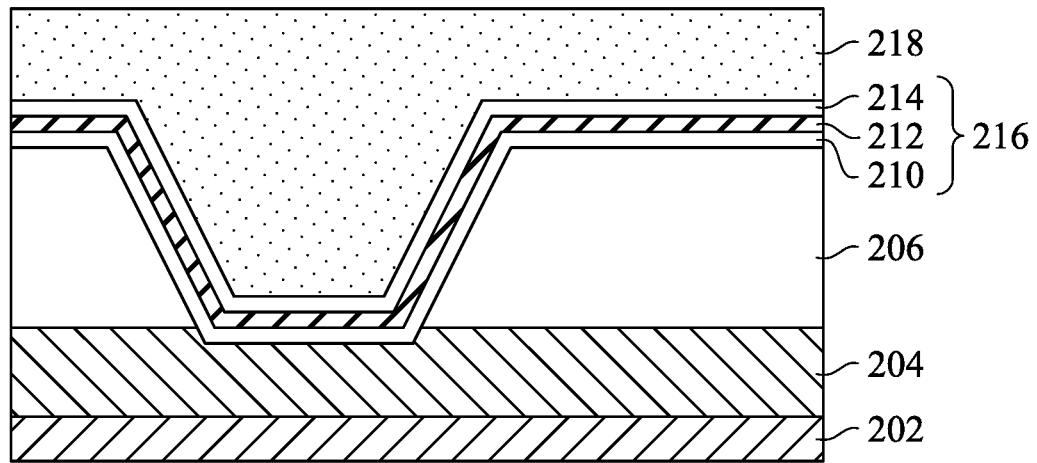

Referring to FIG. 2F, a RDL 218 is formed over the composite barrier layer 216. The RDL 218 may include conductive materials such as aluminum, aluminum alloy, copper, copper alloy, tungsten, doped polysilicon, other metal alloy and metal compound. The RDL 218 may be deposited by PVD, CVD, electrochemical deposition (ECD), or any suitable deposition method. The RDL 218 is electrically connected with the top metal layer 204. An annealing process may also be made.

In various embodiments of the present disclosure, the RDL 218 may include aluminum and the top metal layer 204 may include copper. The composite barrier layer 216 includes the center layer 212 including TaN, the bottom layer 210 including Ta, and the upper layer 214 including Ta. The composite barrier layer 216 may bear the reliability test after baking at 275° C. for 2,000 hours, suppressing the Cu and Al mutual diffusion through the center layer 212, and making the resistance shift of the semiconductor structure less than 10%.

Figure 2G:
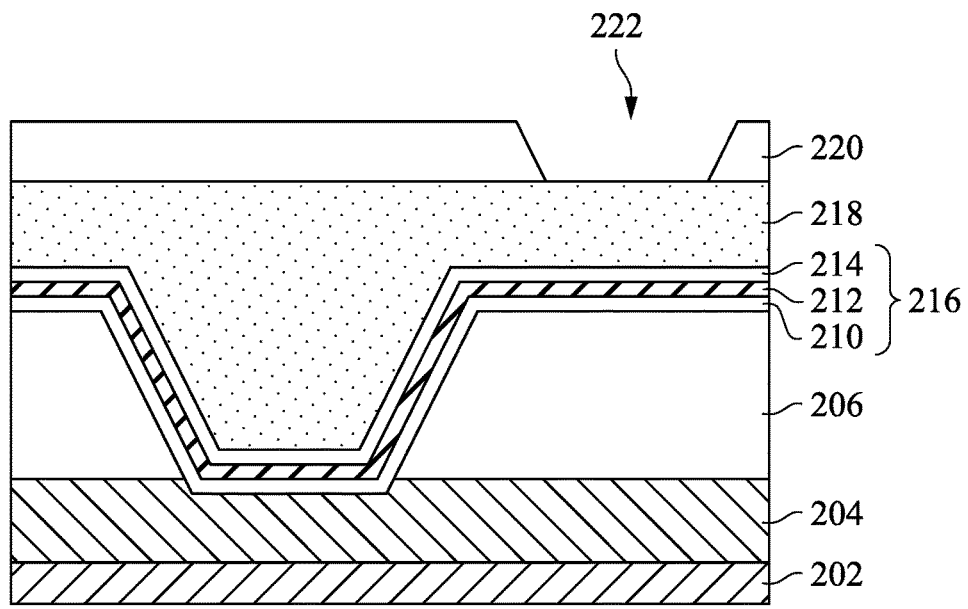
Figure 2H:
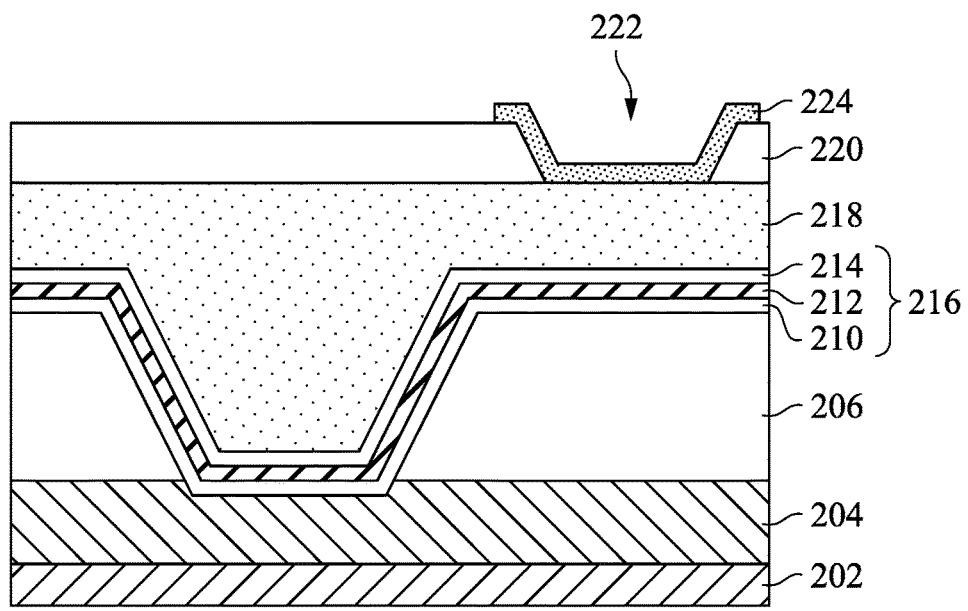
Figure 2I:
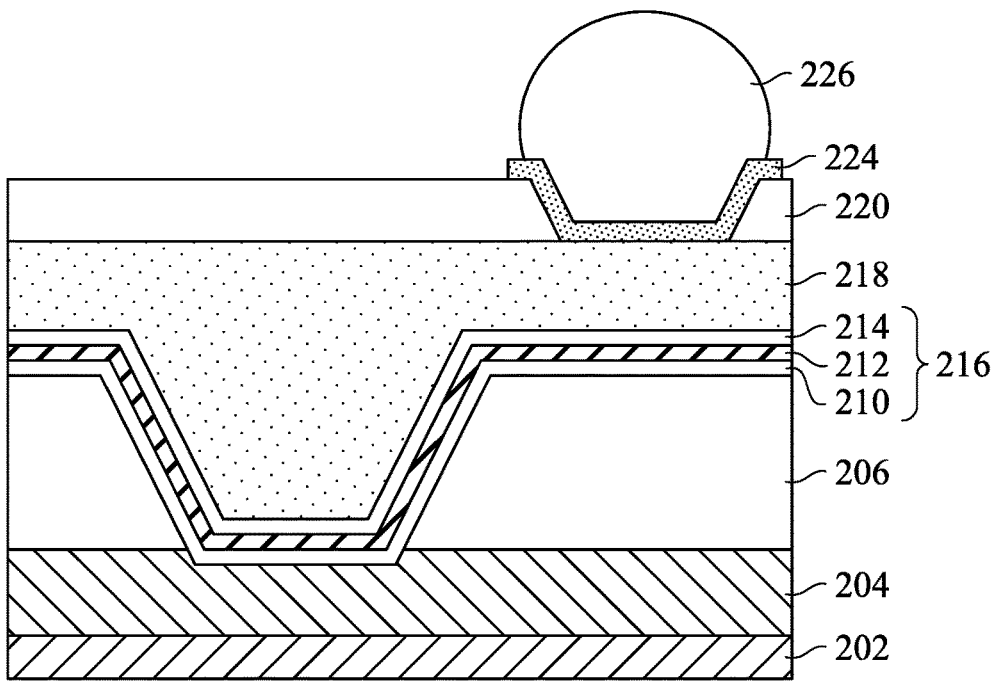

Referring to FIGS. 2G-2I, the semiconductor structure may further include following operations to form bumps for external connection. Referring to FIG. 2G, a protection layer 220 is formed over the RDL 218. And an upper opening 222 is formed in the protection layer 220 to expose the RDL 218. The protection layer 220 may include polymer layer such as an epoxy, polyimide, benzocyclobutene (BCB), polybenzoxazole (PBO), and the like. The protection layer 220 may be formed by any suitable method, such as CVD or PVD. The upper opening 222 may be formed dry etching, wet etching, or RIE.

Referring to FIG. 2H, an under bump metal (UBM) layer 224 is formed over the upper opening 222. The UBM 224 may be made up of Ti, Ta, Ni, NiV, Cu, Cu alloy, or any metal or electrically conductive material by PVD, CVD or any suitable deposition methods. There may be a multiple sub-layers of UBM 224 built on top of each other (not shown).

Referring to FIG. 2I, a bump 226 is formed over the UBM 224. The material of the bump may be any metal or electrically conductive material, e.g., Sn, lead (Pb), Ni, Au, Ag, Cu, bismuthinite (Bi) and mixtures and alloys thereof. The bump is electrically connected with the top metal layer 204.

Figure 3:
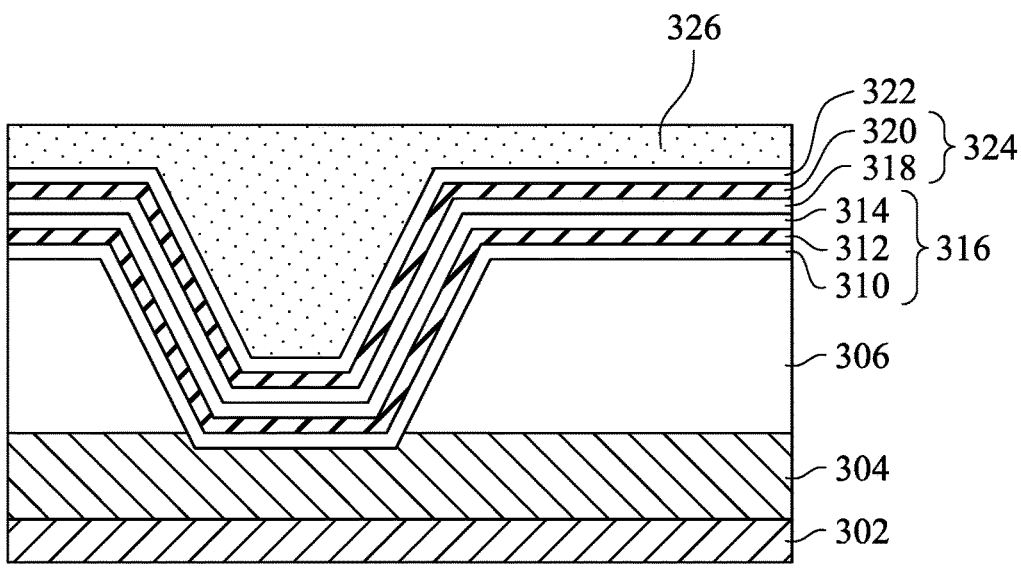
FIG. 3 is a cross-sectional view of a semiconductor structure, in accordance with some embodiments.

Referring to FIG. 3, FIG. 3 is a cross-sectional view of a semiconductor structure, in accordance with various embodiments. The semiconductor structure is mostly the same with the embodiments in FIG. 1. The difference with the embodiment in FIG. 1 is that another composite barrier layer 324 is formed over the composite barrier layer 316 in the present embodiment. The more composite barrier layers formed between the RDL and the top metal layer, the composite barrier layers may have better diffusion barrier ability, but the cost may also increase. Multiple composite barrier layers may be all formed in one PVD operation.

Figure 4:
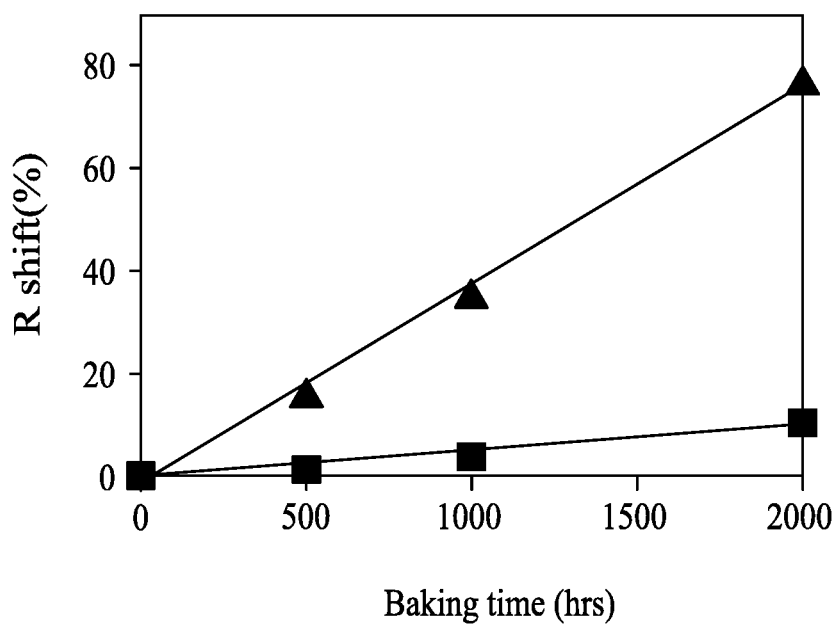
FIG. 4 is an experiment result for the semiconductor structures after a reliability test.

Referring to FIG. 4, FIG. 4 is an experiment result for the semiconductor structure with composite barrier layer and without composite barrier layer, which has only one center layer for diffusion barrier and has no bottom and upper layers, after reliability test. The square data are the result for the semiconductor structure as shown in FIG. 1, which includes the Cu top metal layer, the Ta bottom layer, the Ta upper layer, the TaN center layer, and the Al RDL. The triangle data are the result for the semiconductor structure the same with that of the square data but without the Ta bottom layer and the Ta upper layer. The figure shows the resistance shift result with the baking time at 275° C. And the reason for resistance shift increasing is the material of the RDL or the material of the top metal layer diffuse through the center layer into the other side. When the material of the RDL and the material of the top metal layer are different, the resistance shift may be larger than the materials are the same. Therefore, the semiconductor structure with the composite barrier layer has better performance to reduce the resistance shift after the reliability test. The composite barrier layer may bear the reliability test after baking at 275° C. for 2,000 hours, making the resistance shift of the semiconductor structure less than 10%.

According to various embodiments of the present disclosure, the mechanism of the semiconductor structure is provided. The semiconductor structure having composite barrier layer between the RDL and the top metal layer may suppress the material in the RDL and the material in the top metal layer mutual diffusing through the center layer. Therefore, the semiconductor structure in the present disclosure may improve the reliability issue induced by the stress migration. The composite barrier layer may be formed in one operation, also may be manufactured by the currently used PVD, so no other cost for apparatus needed.

In various embodiments of the present disclosure, a semiconductor structure includes a substrate comprising a top metal layer on the substrate; a passivation layer over the top metal layer having an opening therein exposing the top metal layer; a composite barrier layer over the passivation layer and the opening, the composite barrier layer including a bottom layer over the passivation layer and the opening, a center layer over the bottom layer, and an upper layer over the center layer; and a redistribution layer (RDL) over the composite barrier layer and electrically connecting the underlying top metal layer.

In various embodiments of the present disclosure, the method of manufacturing semiconductor device includes the following operations. A passivation layer is deposited over a top metal layer on a substrate. An opening is formed in the passivation layer to expose the top metal layer. A composite barrier layer is deposited over the passivation layer and the opening. And a redistribution layer (RDL) is deposited over the composite barrier. The composite barrier layer is deposited over the passivation layer and the opening including the following operations. A bottom layer is deposited over the passivation layer and the opening. A center layer is deposited over the bottom layer. And an upper layer is deposited over the center layer.

In various embodiments of the present disclosure, a semiconductor structure includes a substrate including a Cu top metal layer on a substrate; a passivation layer over the Cu top metal layer having an opening therein exposing the Cu top metal layer; a composite barrier layer over the passivation layer and the opening, the composite barrier layer including a Ta bottom layer over the passivation layer and the opening, a center TaN layer over the Ta bottom layer, and a Ta upper layer over the center TaN layer; and an aluminum redistribution layer (RDL) over the composite barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a top metal layer on a substrate;
   a passivation layer over the top metal layer, the passivation layer having an opening therein to expose the top metal layer;
   first and second composite barrier layers over the top metal layer and the passivation layer, wherein the first composite barrier layer covers and physically contacts a top surface of the second composite barrier layer, and each of the first and second composite barrier layers comprises:
   a bottom layer;
   a center layer over the bottom layer; and an upper layer over the center layer; and a redistribution layer (RDL) over the first and second composite barrier layers and electrically connected to the top metal layer, wherein at least a portion of the first composite barrier layer is disposed between the RDL and a top surface of the passivation layer, and, wherein the portion of the first composite barrier layer disposed between the RDL and the top surface of the passivation layer is external to the opening and does not overlap with any portion of the opening.

2. The semiconductor structure of claim 1, wherein the top metal layer comprises copper (Cu).

3. The semiconductor structure of claim 1, wherein the bottom and upper layers both comprise tantalum (Ta) or titanium (Ti).

4. The semiconductor structure of claim 1, wherein the center layer comprises tantalum nitride (TaN) or titanium nitride (TiN).

5. The semiconductor structure of claim 1, wherein the RDL comprises aluminum (Al).

6. The semiconductor structure of claim 1, wherein the top metal layer comprises a material different from that of the RDL.

7. The semiconductor structure of claim 1, wherein a thickness of the bottom and upper layers are both in a range from about 1 nm to about 30 nm.

8. The semiconductor structure of claim 1, wherein a thickness of the center layer is in a range from about 10 nm to about 300 nm.

9. The semiconductor structure of claim 1, further comprising:
a protection layer over the RDL having an upper opening therein exposing the RDL;
an under bump metal (UBM) layer over the upper opening; and
a bump over the UBM layer.

10. The semiconductor structure of claim 1, wherein the bottom layer of the first composite barrier layer covers and physically contacts a top surface of the upper layer of the second composite barrier layer.

11. The semiconductor structure of claim 1, wherein at least a portion of the second composite barrier layer is disposed between the first composite barrier layer and the top surface of the passivation layer.

12. The semiconductor structure of claim 1, wherein at least a portion of the bottom layer of the second composite barrier layer is in contact with the top surface of the passivation layer.

13. A method for manufacturing a semiconductor structure comprising:
receiving a substrate having a top metal layer thereon;
depositing a passivation layer over the top metal layer;
forming an opening in the passivation layer to expose the top metal layer;
depositing first and second composite barrier layers over the top metal layer and the passivation layer, wherein the first composite barrier layer covers and physically contacts a top surface of the second composite barrier layer, and depositing each of the first and second composite barrier layers comprises:
depositing a bottom layer;
depositing a center layer over the bottom layer; and
depositing an upper layer over the center layer; and
depositing a redistribution layer (RDL) over the first and second composite barrier layers, wherein at least a portion of the first composite barrier layer is disposed between the RDL and a top surface of the passivation layer, and, wherein the portion of the first composite barrier layer disposed between the RDL and the top surface of the passivation layer is external to the opening and does not overlap with any portion of the opening.

14. The method of claim 13, further comprising:
depositing a protection layer over the RDL, wherein the protection layer has an upper opening to expose part of the RDL;
depositing an under bump metal (UBM) layer over the upper opening; and
forming a bump over the UBM layer.

15. The method of claim 13, wherein the bottom layer and the upper layer both comprise Ta or Ti.

16. The method of claim 13, wherein the center layer comprises TaN or TiN.

17. The method of claim 13, wherein the top metal layer comprises copper, and the RDL comprises aluminum.

18. The method of claim 13, wherein the first and second composite barrier layers are formed by physical vapor deposition (PVD).

19. A semiconductor structure, comprising:
a Cu top metal layer on a substrate;
a passivation layer over the Cu top metal layer, the passivation layer having an opening therein to expose the Cu top metal layer;
first and second composite barrier layers over the Cu top metal layer and the passivation layer, wherein the first composite barrier layer covers and physically contacts a top surface of the second composite barrier layer, and each of the first and second composite barrier layers comprises:
a Ta bottom layer;
a center TaN layer over the Ta bottom layer; and
a Ta upper layer over the center TaN layer; and
an aluminum redistribution layer (RDL) over the first and second composite barrier layers, wherein at least a portion of the second composite barrier layer is disposed between the aluminum RDL and a top surface of the passivation layer, and, wherein the portion of the second composite barrier layer disposed between the aluminum RDL and the top surface of the passivation layer is external to the opening and does not overlap with any portion of the opening.

20. The semiconductor structure of claim 19, further comprising:
a protection layer over the aluminum RDL having an upper opening therein exposing the aluminum RDL;
an under bump metal (UBM) layer over the upper opening; and
a bump over the UBM layer.

* * * * *